US006528947B1

(12) United States Patent
Chen et al.

(10) Patent No.: US 6,528,947 B1
(45) Date of Patent: Mar. 4, 2003

(54) HOLLOW CATHODE ARRAY FOR PLASMA GENERATION

(75) Inventors: Jyh-Hong Eric Chen, Media, PA (US); Tyau-Jeen Lin, Chadds Ford, PA (US)

(73) Assignee: E. I. du Pont de Nemours and Company, Wilmington, DE (US)

(*) Notice: Subject to any disclaimer, the term of this patent is extended or adjusted under 35 U.S.C. 154(b) by 0 days.

(21) Appl. No.: 09/856,753

(22) PCT Filed: Dec. 6, 1999

(86) PCT No.: PCT/US99/28841

§ 371 (c)(1),
(2), (4) Date: May 21, 2001

(87) PCT Pub. No.: WO00/34979

PCT Pub. Date: Jun. 15, 2000

(51) Int. Cl.[7] .................................................. H01J 7/24
(52) U.S. Cl. .............................. 315/111.21; 118/723 R
(58) Field of Search ................ 315/111.21; 156/345.33, 156/345.44; 284/192.1, 155, 157.15; 118/722, 723 R, 50, 50.1; 313/567, 618

(56) References Cited

U.S. PATENT DOCUMENTS

| 4,209,357 A | * | 6/1980 | Gorin et al. ................. 156/643 |
| 4,637,853 A | | 1/1987 | Bumble et al. ............. 156/345 |
| 4,746,538 A | | 5/1988 | Mackowski .................. 427/38 |
| 5,314,539 A | | 5/1994 | Brown et al. ............... 118/718 |
| 5,627,435 A | | 5/1997 | Jansen et al. ........... 315/111.21 |
| 5,686,789 A | | 11/1997 | Schoenbach et al. ....... 313/491 |
| 5,714,031 A | | 2/1998 | Mundt et al. ............... 156/345 |
| 5,798,139 A | | 8/1998 | Nagashima et al. ........ 427/237 |

FOREIGN PATENT DOCUMENTS

| DE | 19755902 C1 | 5/1999 |
| EP | 0210858 A2 | 2/1987 |
| EP | 0210858 B1 | 2/1987 |
| EP | 0575299 B1 | 12/1993 |
| EP | 0575299 A1 | 12/1993 |
| EP | 0634778 A1 | 1/1995 |
| JP | 01004481 | 1/1989 |
| JP | 02066941 | 3/1990 |
| WO | WO 9414303 | 6/1994 |
| WO | WO 9605112 | 2/1996 |

OTHER PUBLICATIONS

H. Koch Et Al. "Hollow Cathode Discharge Sputtering Device for Uniform Large Area Thin Film Deposition" J. Vac. Sci. Technol. A9(4) (1991) 2374–2377.

O. Kessi and S. Nencib, CIP 93 Proceedings "Comportement et Performances D'un Reacteur Triode Multipolaire a Cathode Creuse Excite A 13.56 MHz et Operant Avec SF6" (1993).

L. Bardos Et Al., Linear Arc Discharge (LAD)—Radio Frequency Hollow Cathode Plasma Source for Low Pressure Procesing 39th Annual Technical Conf. Proceedings (1996) pp128–133.

* cited by examiner

*Primary Examiner*—David Vu
*Assistant Examiner*—Thuy Vinh Tran

(57) ABSTRACT

A cathode assembly is described for use in the creation of a discharge plasma. The cathode comprises a plurality of electrically conductive hollow plasma generating cells in a cylindrically-shaped array, the cells being electrically connected to each other. The plasma generated can be used to modify surface properties of substrates, such as films, fibers, particles and other articles, particularly cylindrically shaped articles.

15 Claims, 11 Drawing Sheets

HOLLOW CATHODE ARRAY FOR PLASMA GENERATION

BACKGROUND OF THE INVENTION

This invention relates to a hollow cathode array for use in the creation of a discharge plasma. The plasma generated can be used to modify surface properties of substrates, such as films, fibers, particles and other articles.

Treatment of various substrates, such as polymers, to impart new surface properties through physical or chemical modification is important for many industries, including the film industry. Wet methods have successfully been used for such treatment; however, such wet methods are associated with problems, such as waste disposal of solvents. Dry methods, such corona treatments, uv treatments, laser treatments, x-ray and gamma-ray treatments have also been utilized with some success. Corona treatment has been in industrial use for several decades but is generally restricted to simple surface geometries, such as web structures. In addition, in some materials the effects of corona treatments fade-away with time. Further, there is little control over what functional groups may end up on the surface of a treated substrate, and the close distance between electrode and substrate can lead to undesirable formation of pin-holes or burn spots. UV, x-ray, gamma-ray and laser treatments are point sources and cannot readily be used to treat large areas. In addition, these treatments are subject to intensity variations or shading effects which may result in some regions receiving less treatment or even being blocked by line-of-sight shadowing.

Treatment of rigid, shaped or molded polymeric containers to impart improved surface properties and gas barrier properties is important to the food and beverage industries. Various application methods have been proposed to coat such containers with a variety of compositions and thereby improve their gas barrier properties. However, there continues to be a need to further increase the gas barrier properties of such containers to make them capable of better retarding the transmission of gases, such as oxygen and carbon dioxide. There also continues to be a need for improved surface properties, especially related to printability, to improve the recycleability of such containers.

Plasma technology has been used in the laboratory for more than 50 years, but it has only recently been practiced on a commercial scale, mainly driven by the semiconductor industries. In the plasma treatment of polymers, energetic particles and photons generated in the plasma interact strongly with the polymer surface, usually via free radical chemistry.

A major advantage of plasma surface treatment as compared with other treatment processes is the lack of harmful byproducts. There are usually no toxic or hazardous liquids or gases that must be disposed of. Usually, the main process byproducts for plasma treatment are CO, $CO_2$, and water vapor, none of which is present in toxic quantities. Theoretically, plasmas can be applied to objects of all possible geometries with varying success using conventional apparatus and processes. Such objects include webs, films, large solid objects with complex shapes, and small discrete parts in large quantities, such as powder.

A major impediment to utilizing plasma processes on an industrial scale is achieving economically acceptable rates of production. The usefulness of plasma processes is readily apparent but the throughput is so low that the processes are economically feasible only for products which acquire greatly enhanced value from the process. Limiting factors include low plasma density and lack of plasma confinement. A plasma modification or polymerization system with a capability for high production rates would lead to rapid growth in the utilization of plasma technology on an industrial scale.

Most devices used to generate plasmas for plasma polymerization and plasma modification are variations of two basic types of electrode configurations: internal parallel plate electrodes and external electrodes. The usefulness of these two processes is limited by the ease in which they can be scaled up to treat large areas while maintaining high plasma density such that minimum residence time can be achieved. The existing DC hollow cathode plasma reactors offer higher plasma density and a higher degree of plasma confinement than the internal parallel plate and external electrodes. However, they cannot be used to treat large areas because a large hollow cathode reactor is inherently difficult to scale up. In order to achieve a desirable plasma density with a large hollow cathode reactor necessary to accommodate large area treatments, such as 60" (152.4 cm) width substrates, an extremely high voltage is required.

EP 634 778 describes an array of hollow cathodes which generates plasma for surface etching and removal of "rolling oils" on metal sheets. The hollow cathode array system comprises a housing having a plurality of uniformly spaced openings along one wall of the housing. The hollow cathode plasma is basically generated in the housing and transported through the openings. The array of such openings serve as a distributor, however plasma intensity and uniformity are not enhanced. Each opening is about $\frac{1}{16}$ inch (0.15 cm) in diameter. The pressure used in the system of EP'778 is within the range of 0.1 to 5.0 torrs (13.33 to 666.61 Pascal), and the power input is in the range of 0.5 to 3.0 kW.

U.S. Pat. No. 5,686,789 describes a discharge device having a cathode with a micro hollow array for use in subminiature fluorescent lamps. This patent covers devices with dimensions on the scale of the mean free path of electrons which is not viable for large area treatments. The electrons undergo oscillatory motion within the micro hollows which produces a micro hollow discharge resulting in increased current capability. In use, the system of U.S. '789 uses a pressure of 0.1 torr to 200 torrs (13.33 to 26,664.48 Pascal). The patent does not mention reactive plasma, plasma polymerization, or surface modification of materials.

H. Koch et al. in an article entitled "Hollow cathode discharge sputtering device for uniform large area thin film deposition," (J.Vac. Sol. Technol. A9 (4), July/August 1991, p. 2374) describe hollow cathode discharge devices which produce higher densities of sputtered particles than conventional discharges. In the hollow cathode plasma sputtering process described therein, a sputtered target, e.g. Cu, is used as the cathode. The process is primarily a physical process in which momentum transfer takes place. The article does not mention using hollow cathode discharge devices in creating reactive plasma for surface; modification or conducting plasma polymerization for depositing a thin layer on substrate surfaces.

There continues to be a need for a process for surface treatment that among others (1) is solventless and/or free of harmful by-products, (2) is versatile in tailoring the treatment to any surface structure, any size, and/or chemistry of a given article, (3) provides a uniform treatment, (4) is capable of a high rate and a high throughput, (5) can be used in a batch or continuous process, and (6) can be operated at low pressure or under other desirable conditions.

SUMMARY OF THE INVENTION

The present invention concerns a cathode assembly for generating a plasma comprising a plurality of electrically conductive hollow plasma generating cells in an array, the cells being electrically connected to each other.

The present invention also concerns a plasma generating apparatus, comprising at least one cathode assembly described above; means for supplying a plasma precursor gas to the cathode assembly; and means for supplying power to the cathode assembly.

The present invention further concerns a method of treating a surface of a substrate comprising positioning the substrate in close proximity to at least one cathode assembly described above; supplying at least one plasma precursor gas to the vicinity of the cathode assembly and the substrate; generating a plasma by supplying power to the cathode assembly; and exposing the surface of the substrate to the plasma for a time sufficient to form a treated surface.

The present invention also concerns a method for packaging a liquid in a molded biaxially oriented polymeric container comprsing (a) forming a molded biaxially oriented polymeric container; (b) exposing at least one surface of the container to a plasma generated from a plasma precursor gas comprising a hydrocarbon using the cathode assembly of the present invention described herein, wherein the array is shaped; (c) introducing a liquid into the container; and (d) sealing the container.

The present invention further concerns a method for reducing the gas permeability of a polyester substrate comprising exposing a polyester substrate to a plasma generated from a plasma precursor gas comprising a hydrocarbon using the cathode assembly of the present invention described herein.

DETAILED DESCRIPTION

Referring initially to FIGS. 1–6 and 10–13,there is generally shown alternative embodiments of the cathode assembly of the present invention. Cathode assembly 1 includes a plurality of cells 2 which together form an array of individual plasma generators. Each cell is defined by a wall or walls 3. The cathode assembly comprises a plurality of electrically conductive hollow plasma generating cells mounted in an array, the cells being electrically connected to each other with such cells being effective in providing uniform plasma treatment to a variety of substrates having small or large treatment area.

By "hollow plasma generating cells" is meant a plurality of cells, each cell being defined by at least one wall. The cells defined by the wall or walls can be of any shape. However, for ease of manufacture, the cells, preferably, have a generally circular cross-sectional shape, a generally elliptical cross-sectional shape, a generally regular or irregular polygonal cross-sectional shape, or any combination of such shapes (see FIGS. 1–6 and 10–13). By "regular polygonal" is meant a cross-sectional shape selected from the group consisting of: triangle, quadrilateral, pentagonal, hexagonal, heptagonal, octagonal, and combinations thereof. For cells possessing irregular polygonal cross-sectional shapes, such shapes can be the same or different.

Figure 8:
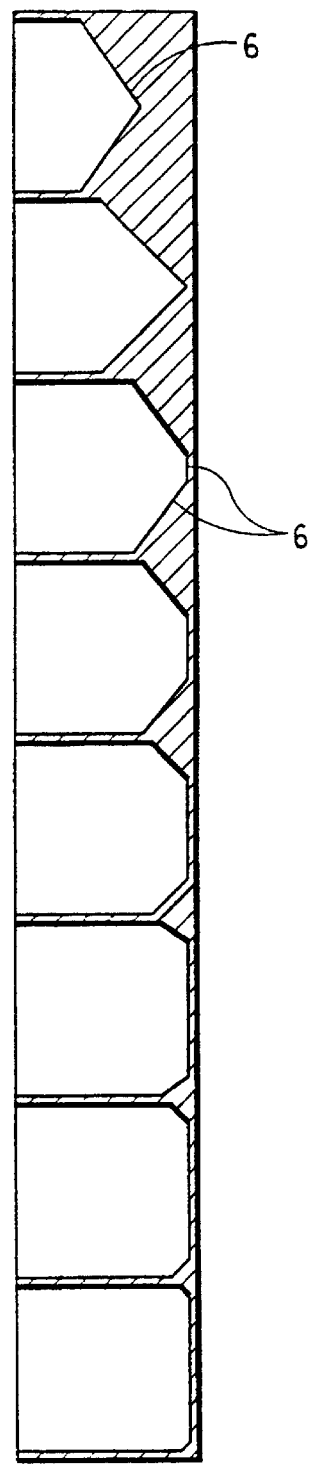
FIG. 8 is a diagram of one embodiment of a cathode assembly of the present invention showing a cross section of cells having various shapes as an end portion.
Figure 9:
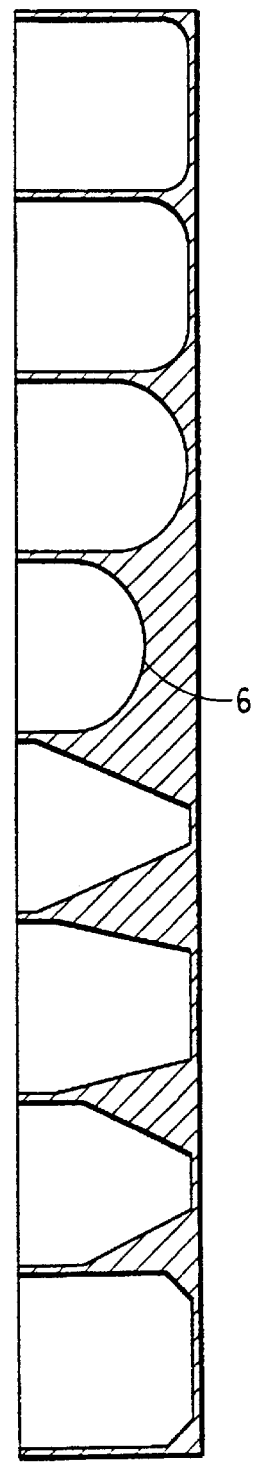
FIG. 9 is a diagram of one embodiment of a cathode assembly of the present invention showing a cross section of cells having various shapes as an end portion.
Figure 10:
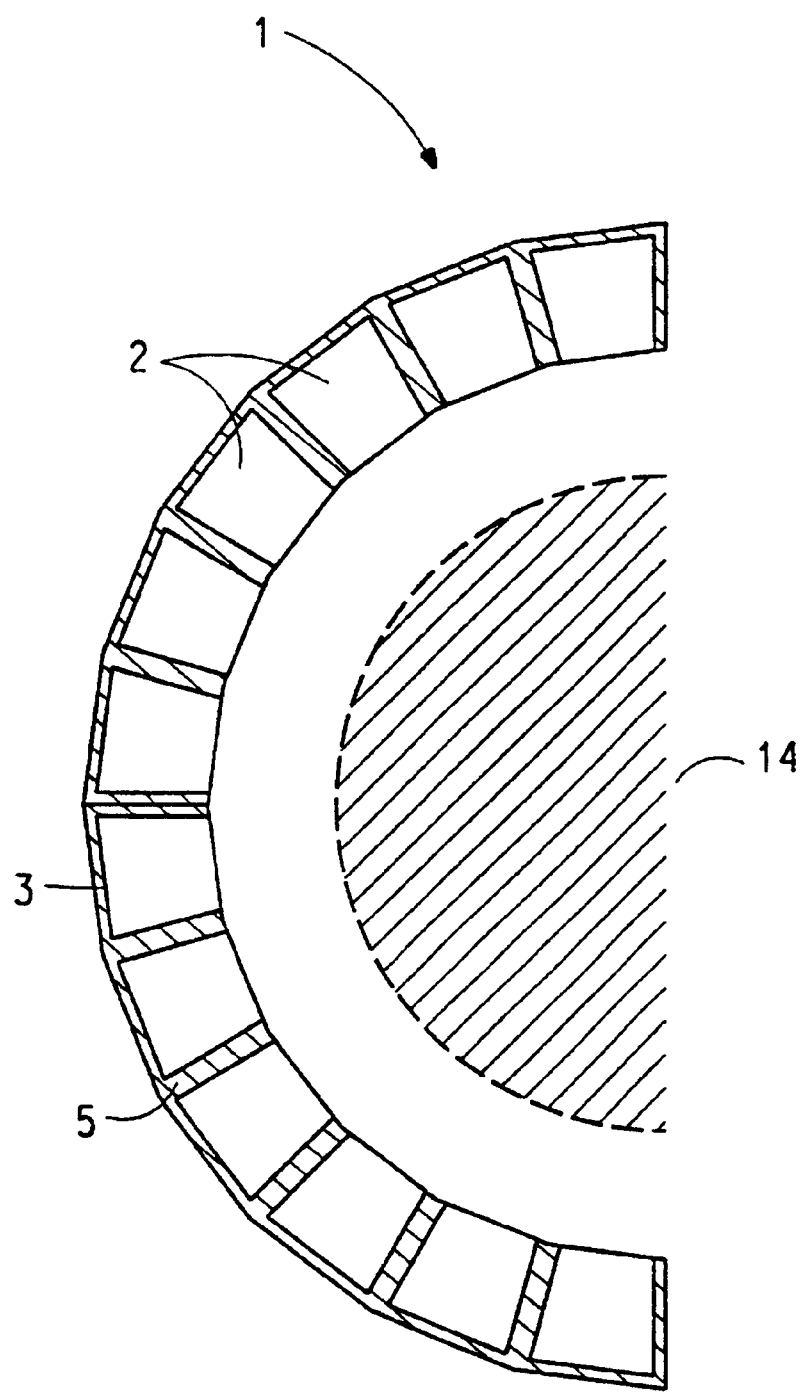
FIG. 10 is a diagram of one embodiment of a cathode assembly of the present invention showing the cells in a shaped array so configured as to treat a shaped substrate.

The cells can be tube-like having two open ends. Alternatively, the cells can be further defined either by a base 5 (see in particular FIG. 10) upon which one open end of the cell is mounted, or each cell can be further defined by an end portion 6 enclosing one end of the cell. Thus, the cell can further comprise an end portion enclosing one end of the cell wherein such end portion is planar, flat bottomed, U-shaped, V-shaped, or other (see FIGS. 7–9). The tube-like cells or the cells further defined by an end portion can be mounted onto a planar or shaped base 5.

For ease of handling and/or connecting to a power source, the cathode assembly can further comprise one or more side pieces 8 which can surround the array of cells. In certain embodiments, side pieces 8 can form all or a portion of the wall of a cell. Side pieces 8 can be attached to at least a portion of the cells on the periphery of the array and/or can be attached to the optional base 5. Holes 4 in the side pieces can facilitate connection to a power source.

By "plasma" is meant a fully or partially ionized gas generated under the influence of extreme thermal conditions or an electric/magnetic field. A plasma is a volume of high-energy electric and magnetic fields that rapidly dissociate any gases present to form energetic ions, photons. electrons, highly-reactive chemical species, neutral stable species, excited molecules, and atoms.

By "array" is meant any configured grouping of cells. This can include a planar array or a shaped array. An array can further include any random arrangement of cells wherein the cells are arranged in such a way as to provide treatment to only selected areas of a substrate.

By "electrically conductive" is meant that the wall, walls, and/or optional end portions or optional base defining the cells or upon which the cells can be mounted, comprise material that can conduct electricity. By "electrically connected to each other" is meant that when the cathode assembly is connected to a power source, by virtue of the electrically conductive material defining each cell, the cells are capable of electrical contact with each other. Materials useful in the manufacture of the cathode assembly of the present invention include any electrically conductive material that will not adversely affect the plasma process, such as stainless steel, aluminum, titanium, copper, tungsten, platinum, chromium, nickel, zirconium, molybdenum or alloys thereof with each other or other known elements.

The openings of the cells can be of variable cross-sectional dimensions, but it is preferred that a plurality of the cells in the array have a ratio of cell cross-sectional area to cell depth in the range of about 0.1 to about 5.0, with a range of about 0.25 to about 4.0 being most preferable. Preferably, the cross-sectional area ranges of each cell ranges from about 0.25 to about 10 $in^2$ (about 1.6 to about 64.5 $cm^2$)

Each cell can be defined by a discrete wall or walls, such walls being unshared with an adjacent cell (see FIGS. 2, 5, 6 and 10). Such cells can be separated from at least one adjacent cell (see FIG. 6), or can have walls that are in contact with at least one wall of at least one adjacent cell (see FIG. 2), or any combination thereof. Alternatively, adjacent cells can share at least one common wall (see FIGS. 1, 3, 4 and 11). Preferably, regular or irregular polygonal shaped adjacent cells share at least one common wall or have walls that are in contact with at least one wall of at least one adjacent cell. Each wall has conducting capability and is of such a thickness as to possess mechanical integrity.

Figure 11:
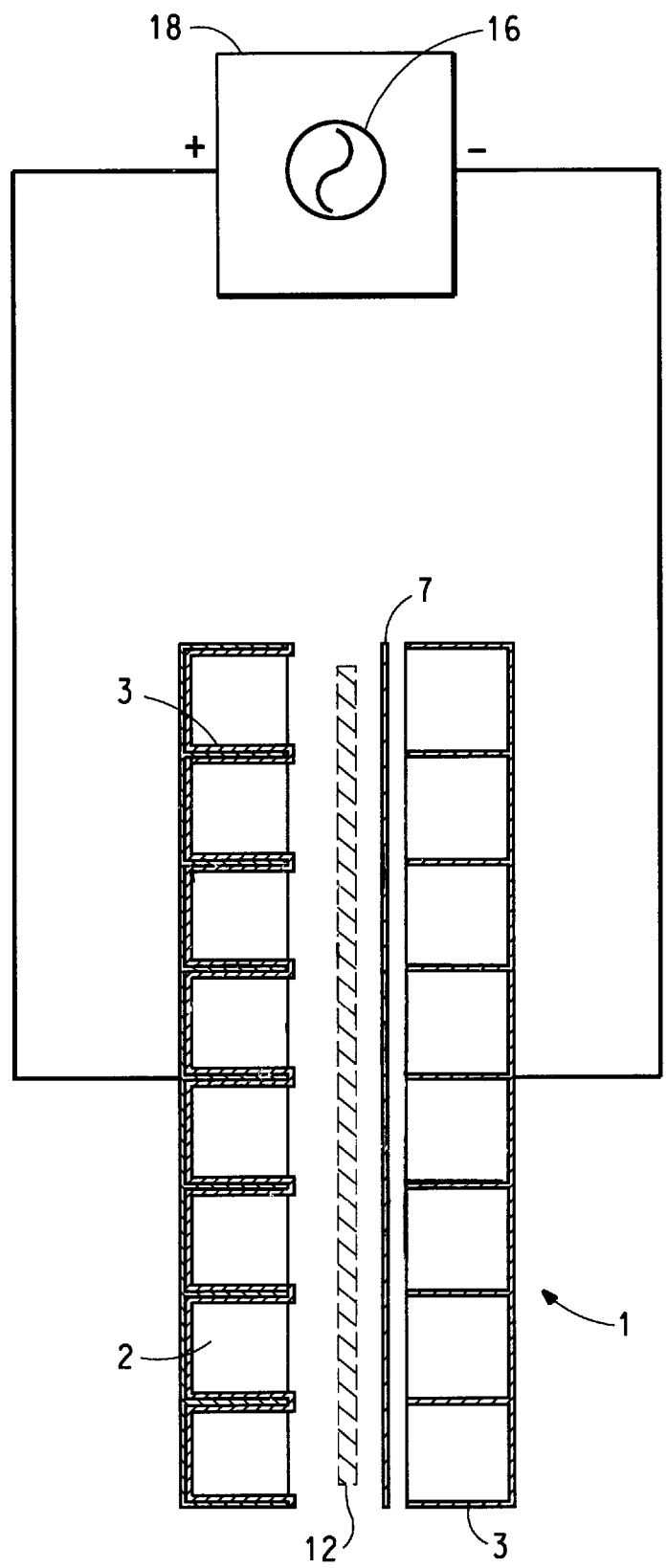
FIG. 11 is a diagram of one embodiment of a plasma generating apparatus of the present invention showing two cathode assemblies, one having a dielectric material coating its walls, the other having a dielectric material disposed adjacent; to at least one cell. Also shown is means of supplying a plasma precursor gas, means for supplying power to the cathode assemblies, and a substrate.

All or a portion of at least one wall 3 of at least one cell of the cathode assembly of the present invention can be coated with a dielectric material (see FIG. 11, cathode assembly on left). In addition or alternately, a dielectric material can be disposed adjacent to at least one cell of the cathode assembly of the present invention (see FIG. 11, cathode assembly on right). Such dielectric material can include mica, ceramic, or a polymeric material having a high dielectric constant. The dielectric material can be coated around the edge of the cell, cover all or a portion of the surface of a wall 3 of the cell, or cover surfaces immediately adjacent the cell 7. The dielectric material can be used to mask certain cells thus preventing plasma generation from that cell when the cathode assembly is in use. Decorative effects can be made on a substrate by masking certain cells during plasma treatment of the substrate.

In order to provide a more uniform plasma treatment, it has been discovered advantageous to provide at least a portion of the cells adjacent the periphery of the array that are smaller in cross-sectional area than the cells in the interior of the array. This embodiment compensates for diffusion loss (see FIGS. 2, 3, 4, 5 and 6).

Figure 12:
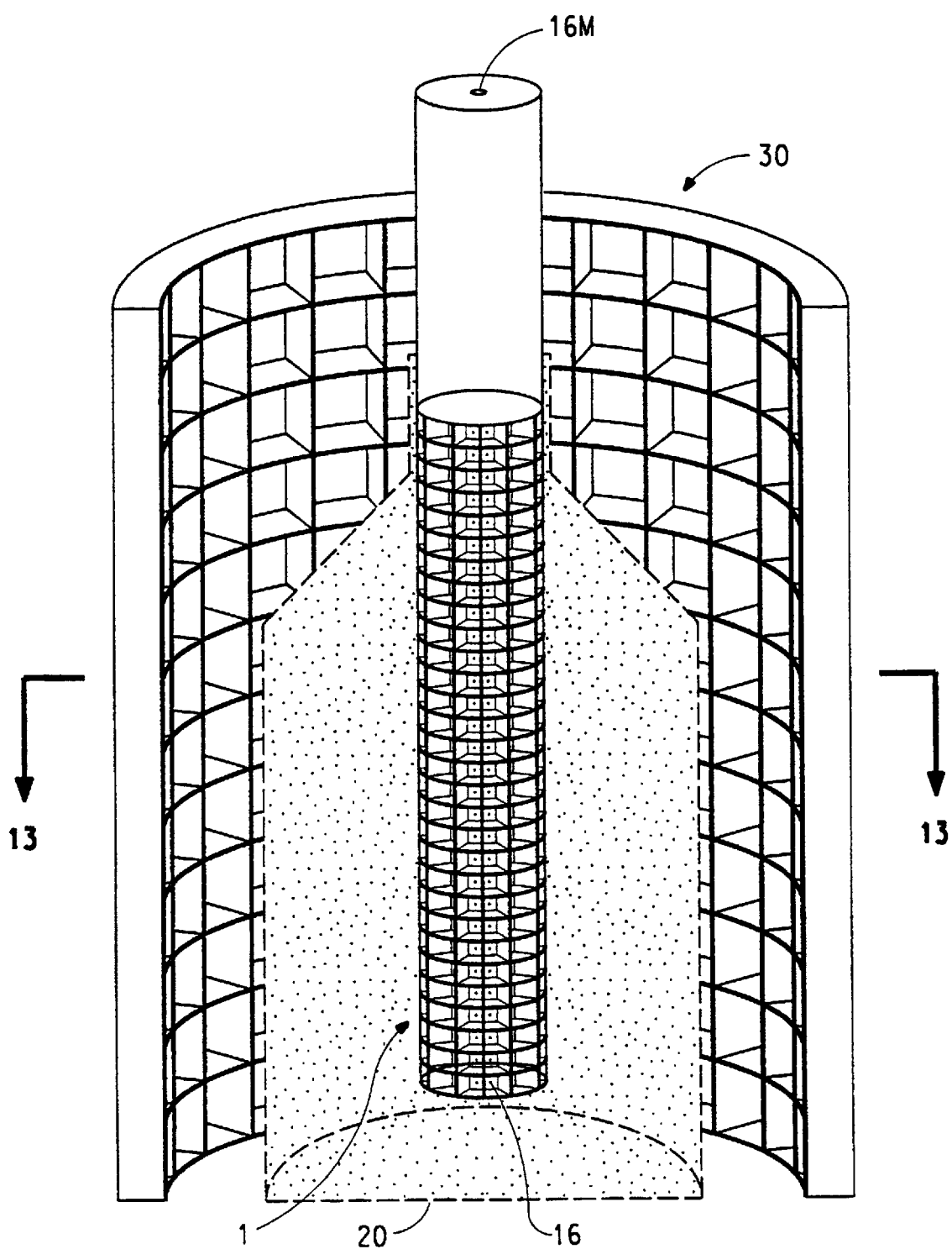
FIG. 12 is a perspective cutaway view of one embodiment of a cathode assembly of the present invention configured to treat a bottle-shaped container.
Figure 13:
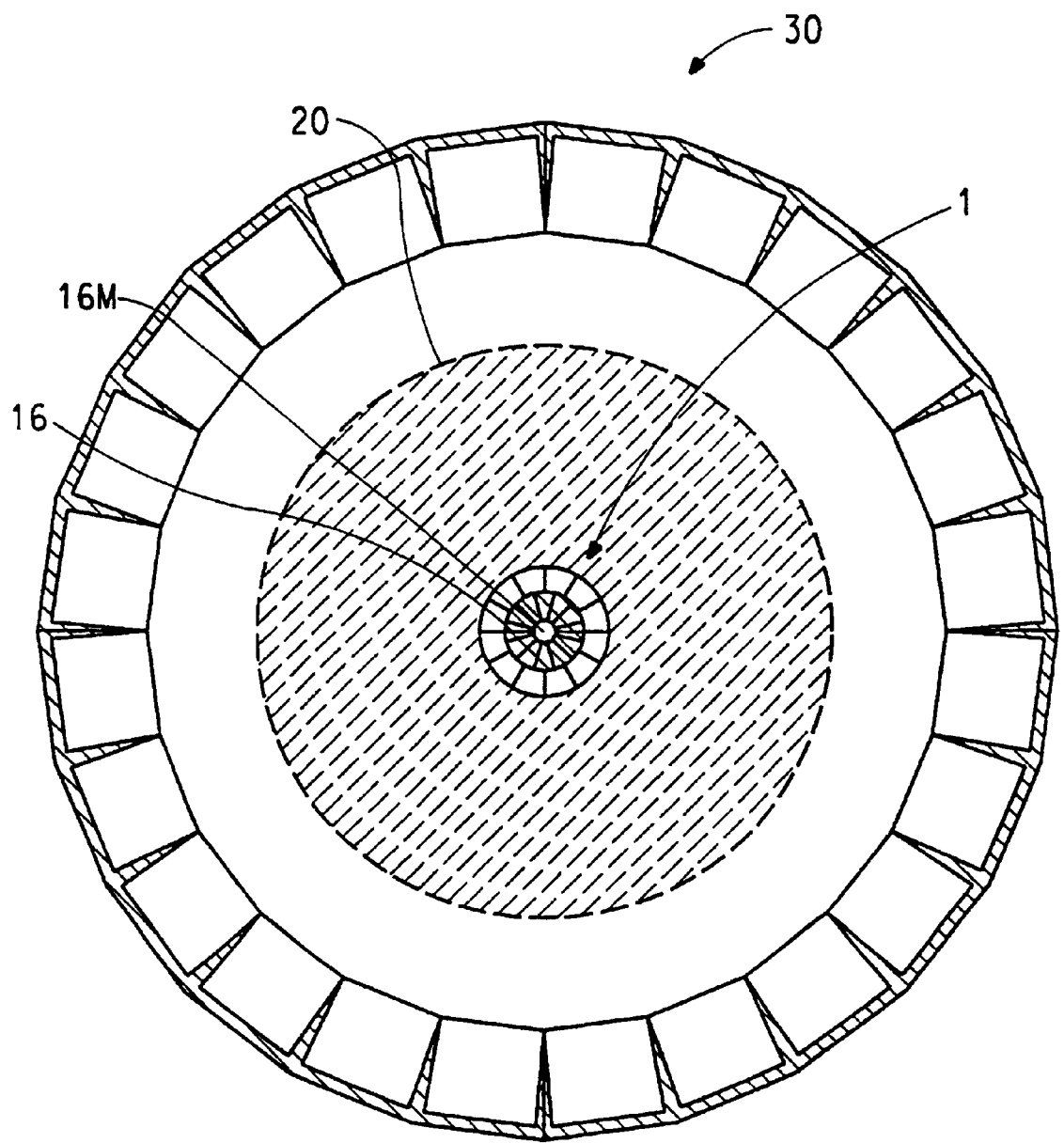
FIG. 13 is a sectional view of the embodiment of FIG. 12.

The cells of the cathode can be arranged in a generally planar array, a preferred embodiment for the treatment of planar substrates 12 (see FIG. 11). Alternatively, the cells of the cathode assembly can be arranged in a shaped array in order to accommodate the shape of an article to be treated, for example an article having a curved, ring-like or other shape 14 (see FIG. 10), such as a bottle (see FIGS. 12 and 13). Such shaped, curved arrays can be configured, for example, to be concave or convex in shape. In FIGS. 12 and 13, cathode assembly 1 is disposed within bottle-shaped container 20 for plasma treatment of the inside surface of the container. Outer electrode 30 is shown having a cellular configuration but could have a simple flat surface. In the embodiment shown in FIGS. 12 and 13, the polarity could be reversed and a gas feed provided to electrode 30 whereby the outer surface of bottle-shaped container 20 could be treated.

One or more walls of a cell can be substantially perpendicular to the plane of the entire array (see FIG. 7), or to the plane of that portion of the array upon which the particular cell is located. Alternatively, one or more walls of each cell can have at least a portion of one wall forming an obtuse angle with the plane of the array (see FIGS. 8 and 9), or to the plane of that portion of the array upon which the particular cell is located.

It is preferable that the array's configuration conform to the shape of the substrate so as to maintain a reasonably uniform spacing between the assembly of cells and the portion of the substrate to be treated. Such a reasonably uniform spacing allows for more even treatment.

Cathode assemblies of the present invention can be made by machine cutting the conductive material into pieces of a desired length, width and thickness and placing these pieces into a desired array arrangement. Pieces can be fit together in a slot arrangement, placed in a tight configuration as to be wedged together, or welded by a typical sheet metal spot-welding process. Other methods of fabrication of the cathode assemblies of the present invention would be readily apparent to one of ordinary skill in the art.

The present invention also concerns a plasma generating apparatus, comprising the cathode assembly described above; means for supplying a plasma precursor gas to the cathode assembly; and means for supplying power to the cathode assembly (see FIG. 11).

Figure 7:
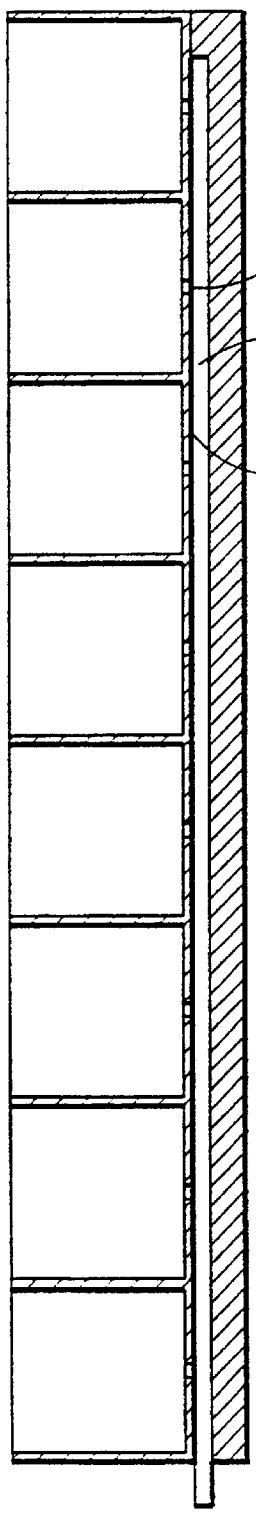
FIG. 7 is a diagram of one embodiment of a cathode assembly of the present invention showing a cross section of cells having a flat-bottom end portion.

The plasma precursor gas can be supplied by a gas jet 16 (see FIGS. 7, 12 and 13) disposed in relation to the cathode assembly such that the precursor gas diffuses to the vicinity of the cells. FIG. 7 shows a manifold 16M connected to individual gas jets 16, each located in a cell. FIGS. 12 and 13 also show a manifold 16M connected to individual gas jets 16 located in the center electrode, which is disposed inside bottle 20. The plasma gas can be fed through a plasma gas feeding line (not shown) and the gas mass flow rate can be controlled by using an appropriate plasma gas flow controller, such as a MKS Type 1179A, available from MKS Instrument, Inc. The flow rate is application dependent. Many applications can be suitably handled using flow rates of about 0.1 to about 100 standard cubic centimeter per minute (sccm), preferably about 0.5 to about 15 sccm. Other applications can be handled using higher or lower flow rates.

The source of power 18 (see FIG. 11) can be a DC source, or an AC source operating at an audiofrequency (AF), or radiofrequency (RF). The power source is connected to the cathode assembly by suitable fasteners (not shown) which can be, in one embodiment, inserted into holes 4. For many treatment applications, less than 1 kW of power is needed, preferably about 1 to about 1000 kW is used, most preferably about 5 to about 200 watts. However, there are applications in which power input higher than 1 kW is required to achieve the desired results. A liquid electrode cooling system can be used in such cases.

Low pressure (in vacuum) is used in the plasma treatment herein. Thus, the present plasma generating apparatus further comprises a vacuum chamber within which the cathode assembly resides, and means for providing a vacuum. A suitable vacuum chamber such as a cylindrical stainless steel vacuum chamber has been found suitable. Commercially available vacuum pumps comprising a booster pump in combination with a rotary pump, such as E2M80/EH500, available from Edwards High Vacuum International can be used. Pressures useful in the present invention can range from about 1 millitorr to about 100 torrs (0.1333 to 13,332.24 Pascal), preferably about 1 millitorr to about 1 torr (0.1333 to 133.32 Pascal). Batch or continuous processing is possible when using the present plasma generating apparatus or method. Although vacuum systems tend to lend themselves to batch processing, a continuous operation can be maintained for sub atmospheric pressures through use of a stage interlock vacuum system. By "stage interlock vacuum system" is meant a series of chambers at differential pressures.

The present invention further concerns a method of treating at least one surface comprising positioning the at least one surface of the substrate in close proximity to at least one cathode assembly described above; supplying at least one plasma precursor gas to the vicinity of the cathode assembly and the substrate; generating a plasma by supplying power to the cathode assembly; and exposing at least one surface of the substrate to the plasma for a time sufficient to form a treated surface.

First, at least one surface of a substrate is positioned in close proximity to at least one cathode assembly described above. By "close proximity" is meant that the substrate is spaced an appropriate distance from the cathode assembly sufficient to receive plasma treatment. One or more cathode assemblies can be used to treat a substrate. Substrates useful for treatment herein include fiber, film, particles, and shaped articles, such as bottles or other containers. The substrate can be mounted parallel to and spaced a preselected distance from at least one cathode assembly of the present invention. In using shaped cathode assemblies, it is preferred that a reasonably uniform distance between the substrate and the cells is maintained in order to provide even treatment of the substrate.

The fiber, film, particle or shaped article substrates can be made from thermoplastic polymeric materials. Films and rigid containers contemplated for use in the present invention include those formed from conventional thermoplastic polymers, such as polyolefins, polyamides, and engineering polymers, such as polycarbonates, and the like. The invention is applicable to films and rigid, i.e., shaped, containers, and injection stretch blow molded biaxially oriented hollow thermoplastic containers, such as bottles, formed from synthetic linear polyesters, such as polyethylene terephthalate (PET), polybutylene terephthalate (PBT), polyethylene naphthalate (PEN), and the like, including homopolymers and polycarbonates, and the like. The invention is applicable to films and rigid, i.e., shaped, containers, and injection stretch blow molded biaxially oriented hollow thermoplastic containers, such as bottles, formed from synthetic linear polyesters, such as polyethylene terephthalate (PET), polybutylene terephthalate (PBT), polyethylene naphthalate (PEN), and the like, including homopolymers and copolymers of ethylene terephthalate and ethylene naphthalate wherein up to about 50 mole percent or more of the copolymer can be prepared from the monomer units of diethylene glycol; propane-1,3diol; butane-1,4-diol; polytetramethylene glycol; polyethylene glycol; polypropylene glycol and 1,4- hydroxymethycyclohexane substituted for the glycol moiety in the preparation of the copolymer; or isophthalic, dibenzoic; naphthalene 1,4- or 2,6-dicarboxylic; adipic; sebacic; and decane-1,10-dicarboxylic acid substituted for the acid moiety in the preparation of the copolymer. The foregoing description is intended to be an illustration of applicable polymeric substrates and not by way of a limitation on the scope of the invention.

Second, in the present method, at least one plasma precursor gas is supplied to the vicinity of the cathode assembly and the substrate. Plasmas can be classified into three categories (1) chemically nonreactive plasma; (2) chemically reactive but non-polymer-forming plasma; and (3) chemically reactive and polymer-forming plasma. The plasma precursor gas employed can be chosen based on the desired treatment to be provided by the plasma. A suitable precursor gas can be, for example, nitrogen; hydrogen; oxygen; ozone; nitrous oxide; a gas comprising a hydrocarbon, such as methane, ethylene, butadiene or acetylene; argon; helium; ammonia; and the like; and mixtures of gases such as hydrocarbon/nitrogen mixtures, air; halides; halocarbons; and polymerizable monomers. For example, polymer films can be treated with virtually any organic or metallorganic compound capable of introduction into the plasma discharge zone. The precursor gas or gases are fed into the vacuum chamber at a desired gas flow rate via a gas jet.

A plasma is generated by supplying power to the cathode assembly. The cathode assembly is connected to a power supply, and the power supply is turned on to initiate the plasma state. The power is then adjusted to a desired power level. The power level can vary depending on the gas flow rate, the size of substrate, the distance from the cathode assembly to the anode, a molecular weight of the plasma precursor gas, and pressure. The electrical power and gas flow rates can be adjusted so as to form an intense plasma discharge in all of the desired cells of the cathode assembly. Optionally, magnetic enhancement may be used to focus the plasma as it exits the cells.

Finally, at least one surface of the substrate is exposed to the plasma for a time sufficient to form a treated surface. The plasma treatment should be maintained for a desired period of time which can range from several seconds to several minutes. The treatment time depends on the characteristics of the plasma and its interaction with the substrate surface which depend on the operational parameters under which the plasma is maintained. Such parameters include gas flow rate, input power, pressure, discharge power and substrate position. Treatment time can also depend on the nature of the substrate.

The present invention is useful for packaging beverages. Thus the present invention further concerns a method for packaging a liquid in a molded biaxially oriented polymeric container comprising forming a container; exposing at least one surface of the container to a plasma generated from a plasma precursor gas comprising a hydrocarbon using the cathode assembly of the present invention described herein, wherein the array is shaped; introducing a liquid into the container; and sealing the container. This method can further comprise purging the gas from the container prior to introduction of the liquid. This method can be suitable for carbonated liquids.

The present invention is suited for improving the gas barrier performance of poly(ethylene terephthalate) films and rigid containers used for packaging foods and beverages, and injection stretch blow molded PET bottles used for packaging carbonated soft drinks and beer. Thus the present invention includes a method for reducing the gas permeability of a polyester substrate comprising exposing at least one surface of a polyester substrate to a plasma generated from a plasma precursor gas comprsing a hydrocarbon using the cathode assembly of the present invention, described herein.

The present invention is useful in processes including surface cleaning (removal of organic contamination); etching or ablation (removal of a weak boundary layer and increasing the surface area); cross-linking or branching of near-surface molecules, which can cohesively strengthen the surface layer and hence the physical properties; chemical modification/grafting by deliberate alteration of the surface region with new chemical functionalities; and thin film deposition, alteration of the surface properties of a substrate to tailor adhesion needs or a barrier coating to capitalize on the bulk properties of a thin, pinhole-free, and highly adherent film in permeant-selective membranes.

EXAMPLE 1

Adhesion Enhancement for Polyimide Film to Copper

Figure 1:
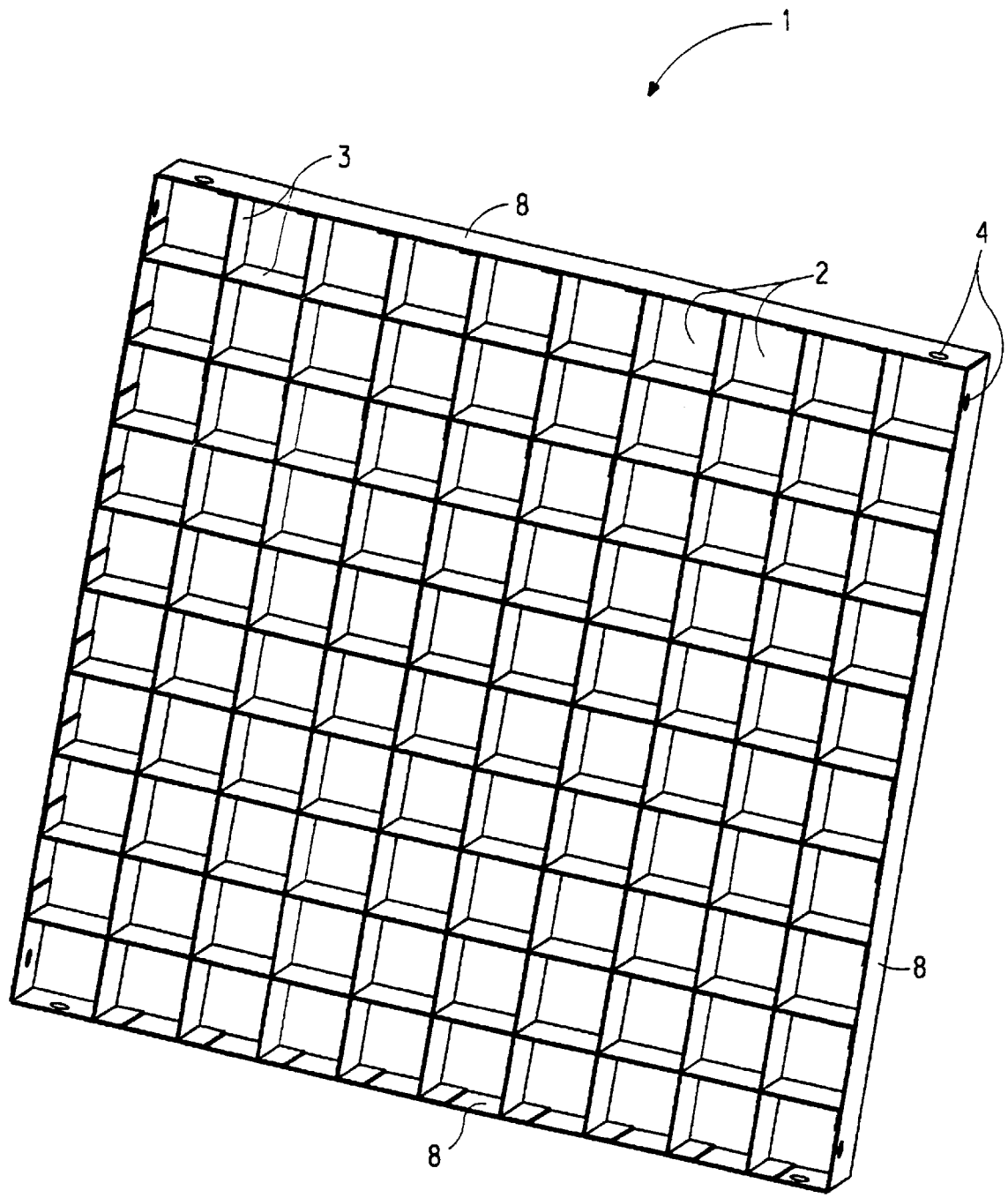
FIG. 1 is a diagram of one embodiment of a cathode assembly of the present invention showing cells having a generally square cross-sectional shape.
Figure 2:
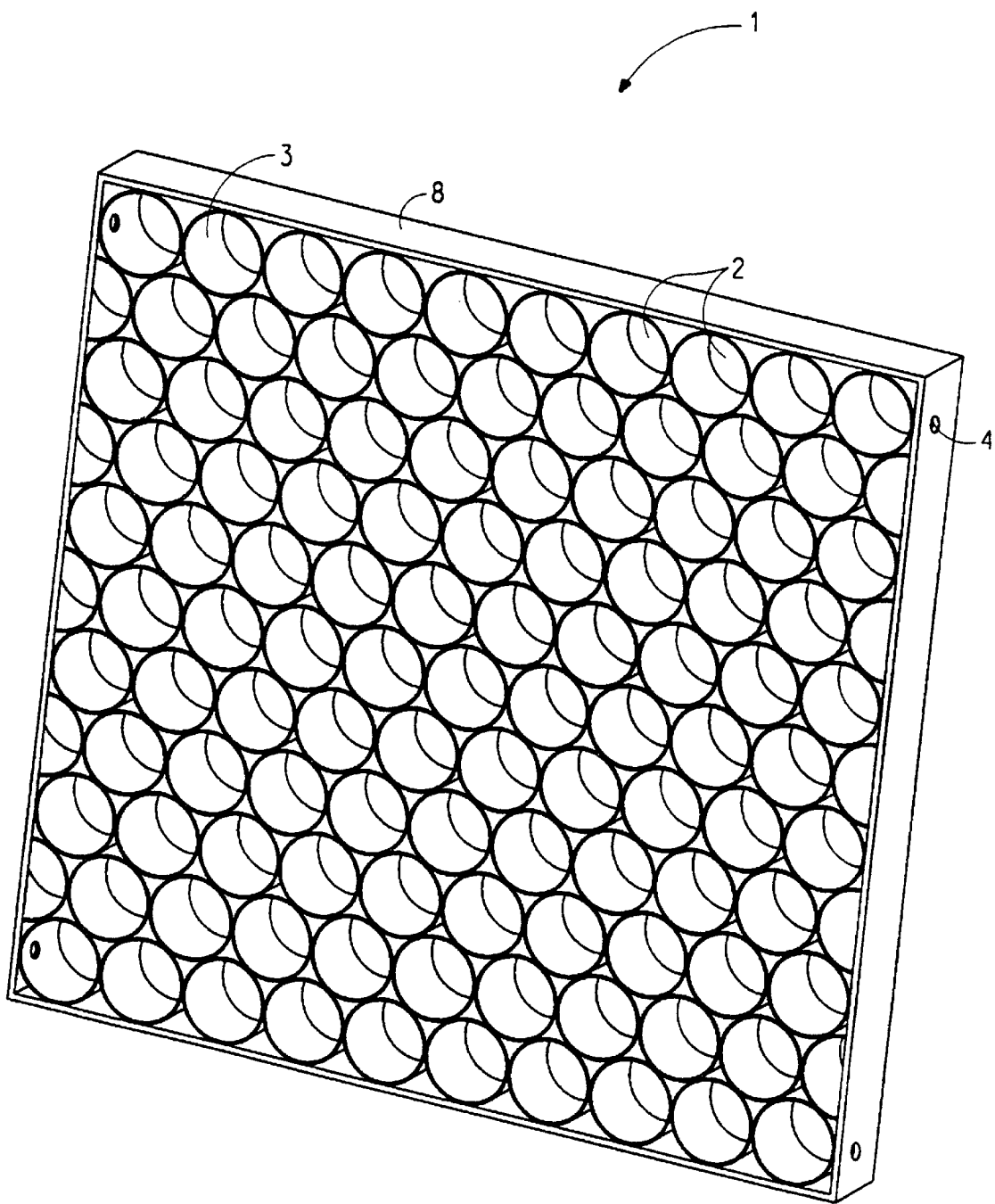
FIG. 2 is a diagram of one embodiment of a cathode assembly of the present invention showing cells having a generally circular cross-sectional shape.
Figure 3:
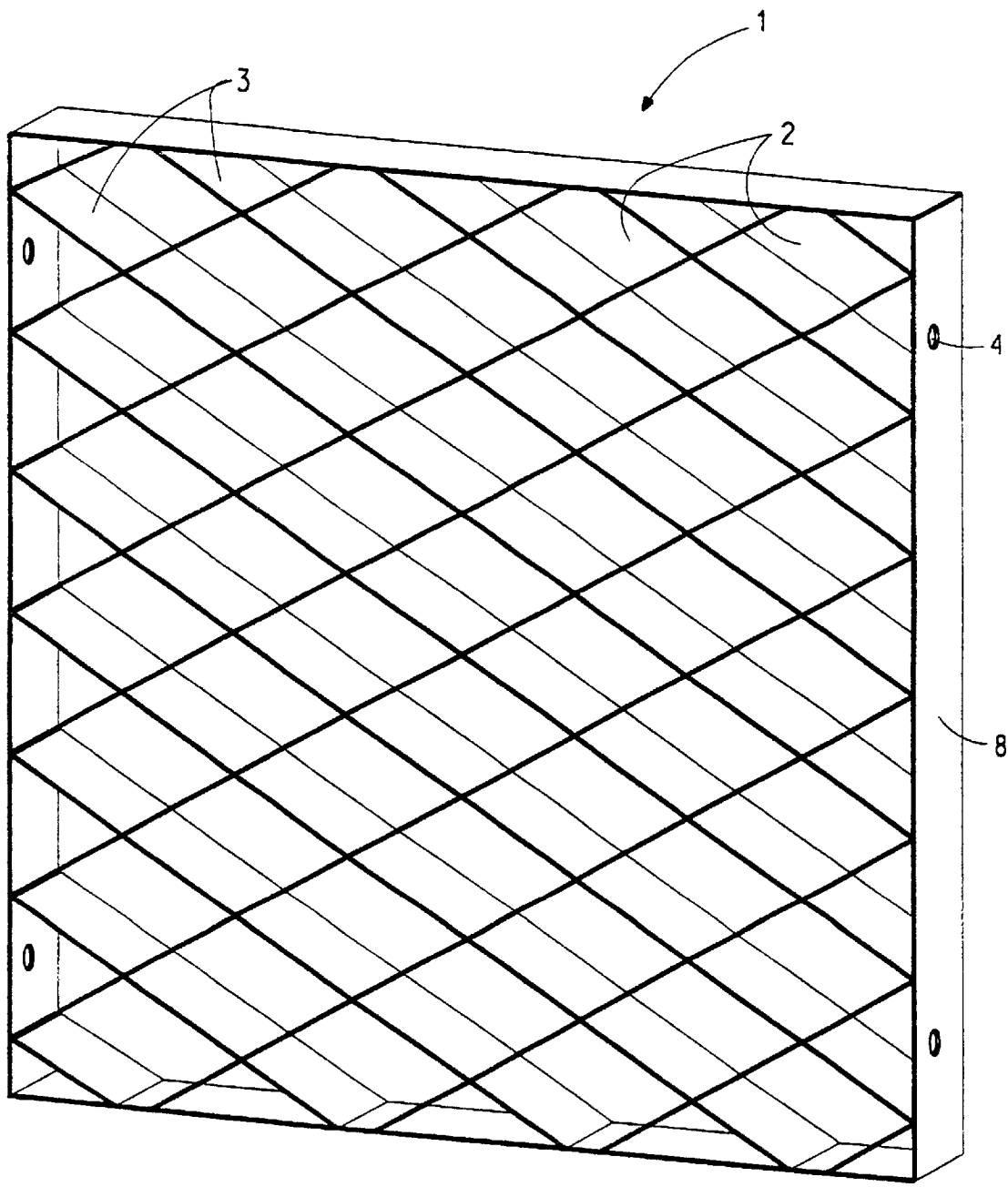
FIG. 3 is a diagram of one embodiment of a cathode assembly of the present invention showing cells having a generally quadrilateral cross-sectional shape.
Figure 4:
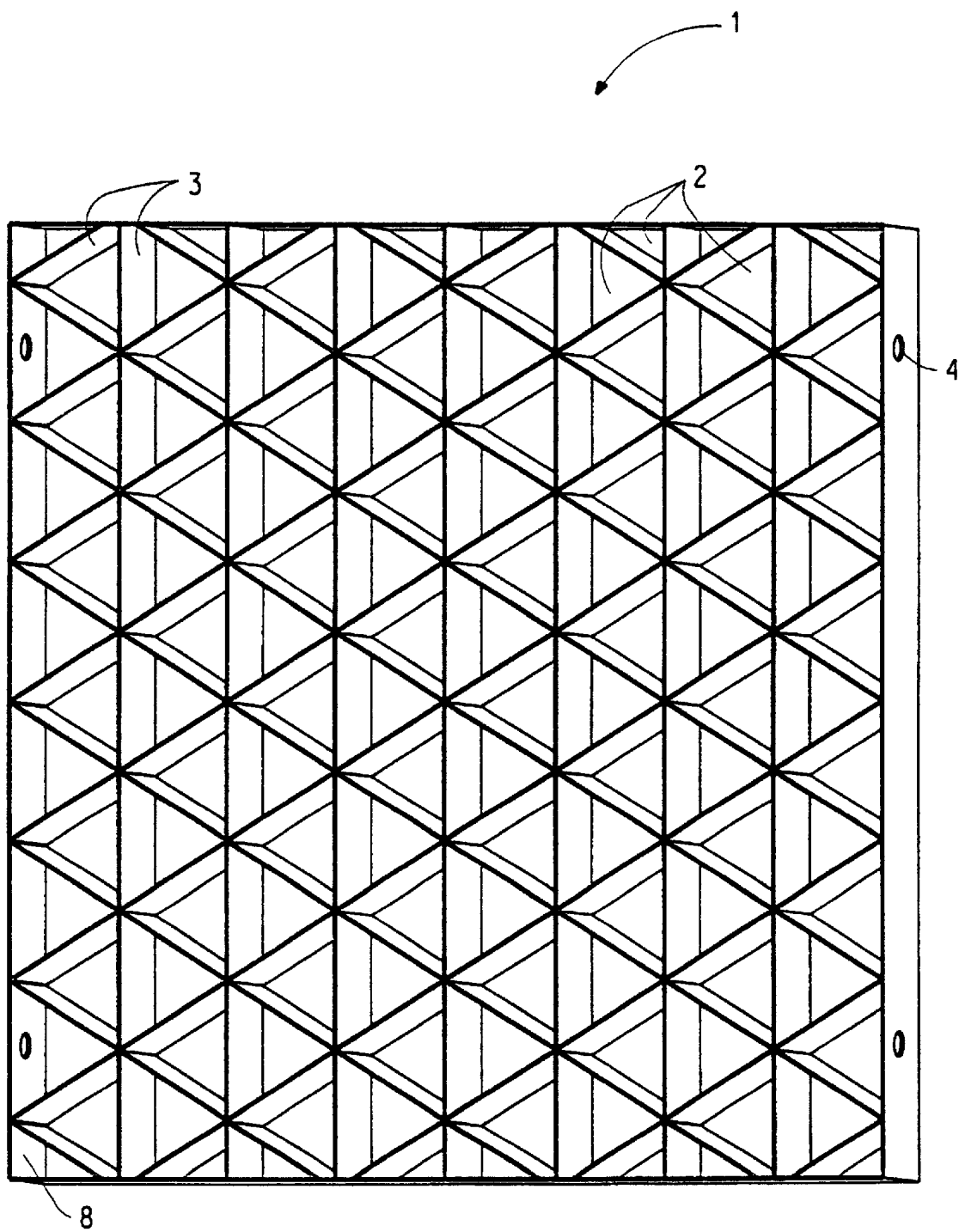
FIG. 4 is a diagram of one embodiment of a cathode assembly of the present invention showing cells having a generally triangular cross-sectional shape.
Figure 5:
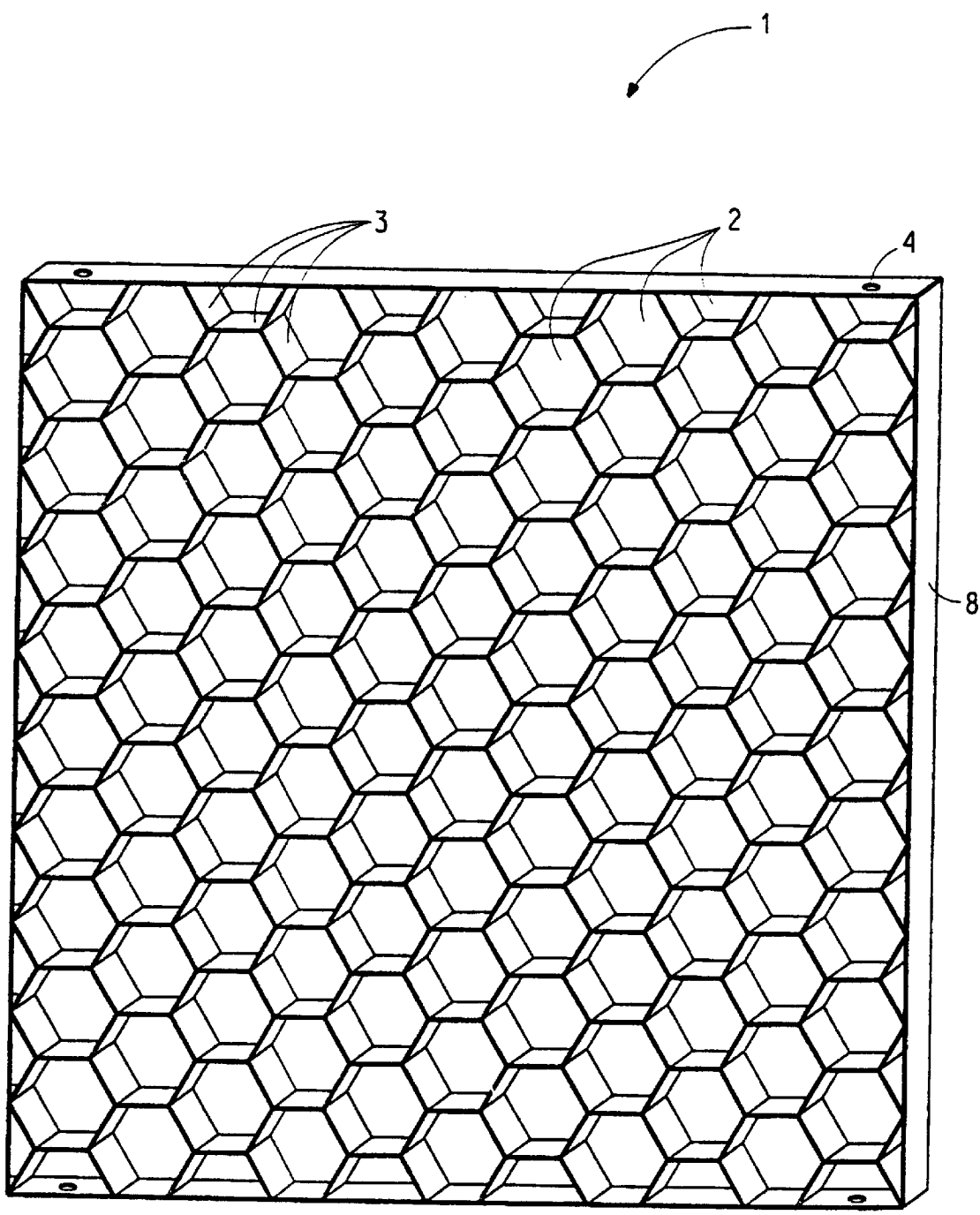
FIG. 5 is a diagram of one embodiment of a cathode assembly of the present invention showing cells having a generally hexagonal cross-sectional shape.
Figure 6:
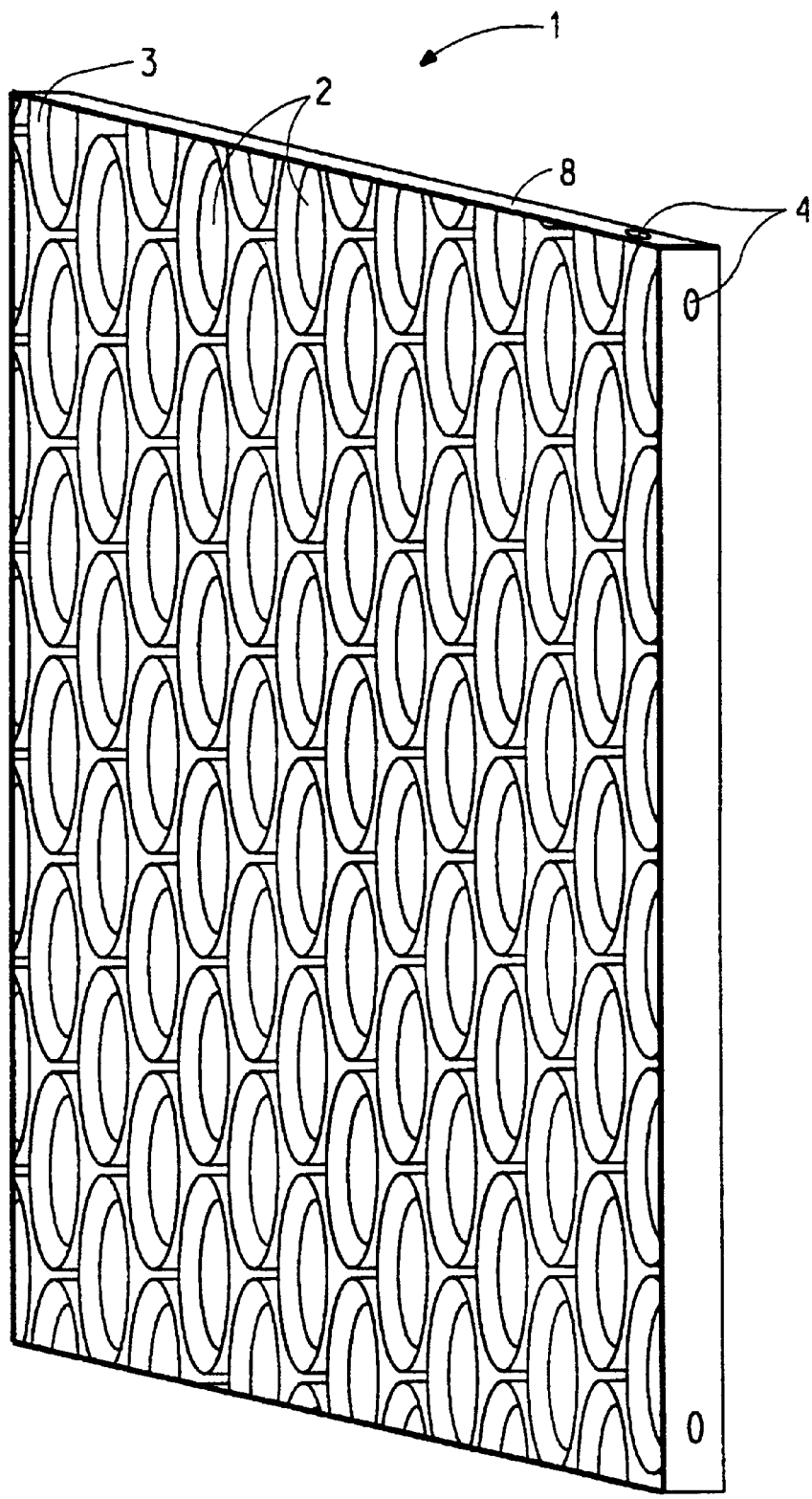
FIG. 6 is a diagram of one embodiment of a cathode assembly of the present invention showing cells having a generally elliptical cross-sectional shape.

Two 12 in×12 in (30.48 cm×30.48 cm) cathode assemblies having a square cell pattern similar to that shown in FIG. 1 were made out of stainless steel. Each cell measured 1 in×1 in×1 in (2.54 cm×2.54 cm×2.54 cm), and the ratio of the cross-sectional area of the cell to the depth of the cell was equal to 1.0. The two cathode assemblies were mounted parallel to each other in a vacuum chamber and each cathode was connected to a DC power supply. Kapton® polyimide film, available from E. I. du Pont de Nemours and Company, Wilmington, Del., was placed between the cathodes at a distance of about 2 in (5.08 cm) from each cathode. A vacuum was induced with a pressure of 150 millitorrs. Ammonia was introduced into the chamber at a flow rate of 12 standard cubic centimeter per minute (sccm) and power was supplied at a voltage of 560 V. The film was exposed to the ammonia plasma for 1 min.

Using a conventional nip-roll process, the treated film was then laminated with adhesive and copper. The lay-up consisted of 1 oz (28.34 grams) copper, a layer of 1 mil (0.0254 mm) Pyralux® sheet adhesive, the polyimide film strip, another layer of 1 mil sheet adhesive and another layer of 1 oz. (28.34 grams) copper to form a clad.

In order to test the adhesion strength of the copper to the rest of the clad, the copper was placed in the upper jaw of an Instron machine and the rest of the clad was adhered with two-sided sticky tape to a German wheel. The wheel was rotated as the copper was peeled with the intent of maintaining a 90 degrees peel angle. The draw rate was 2 in/min (5.08 cm/min). The bond values in pounds per linear inch (pli) (newtons per meter (N/m)) and the surface energies for the control and the ammonia plasma treated sample are listed below:

| Sample | Bond Value (pli) | (N/m) | Polar Surface Energy (dynes/cm) |
| --- | --- | --- | --- |
| Control | 6.9 | (1208.19) | 10.7 |
| Ammonia-treated | 13.0 | (2267.3) | 23.2 |

EXAMPLE 2

Barrier Properties Enhancement for Poly(ethylene terephthalate) (PET) Films 5"×5" (12.7 cm×12.7 cm) MYLINEX® type S PET films, available from DuPont Co., Wilmington, Del., were placed between the assemblies, as described in Example 1, for plasma thin film deposition to create a higher barrier for oxygen permeation through the PET films. A vacuum was induced with a pressure of 150 millitorrs. Acetylene was introduced into the chamber at a flow rate of 25 sccm and power was supplied at a voltage of 640 V. The film was exposed to the acetylene plasma for 10 min. The treated films were then evaluated for Oxygen Permeation Rate, also known as Oxygen Transmission Rate (OTR) by using OXTRAN®1000 made by Mocon, Inc. by following ASTM D3985 with 50% Relative Humidity (RH) at 30° C. Results are listed below.

| Sample | Thickness (mils) | (mm) | OTR (cc/m$^2$/day) |
| --- | --- | --- | --- |
| Control | 4.94 | 0.125 | 12.57 |
| Acetylene-Treated | 4.88 | 0.124 | 2.48 |

What is claimed is:

1. A plasma generating apparatus, comprising:
   at least one, cathode assembly for generating a plasma, comprising:
   a plurality of electrically conductive hollow plasma generating cells in a cylindrically-shaped array arranged on a cylindrical surface, the cells being electrically connected to each other;
   means for supplying a plasma precursor gas to the at least one cathode assembly; and
   means for supplying power to the cathode assembly.

2. The plasma generating apparatus of claim 1 wherein the precursor gas is supplied adjacent to the cathode assembly whereby the gas diffuses to the vicinity of the cells.

3. The plasma generating apparatus of claim 1 wherein the cathode assembly further comprises a manifold and one or more passages in communication with the cells and precursor gas is supplied to the cathode assembly through said passages to said cells whereby the gas diffuses to the vicinity of the cells.

4. The plasma generating apparatus of claim 1 wherein the cells are arranged in the cylindrically-shaped array on an inner surface of the cylinder.

5. The plasma generating apparatus of claim 1 wherein the cells are arranged in the cylindrically-shaped array on an outer surface of the cylinder.

6. The plasma generating apparatus of claim 1 wherein the plurality of cells have a cylindrical cross-sectional shape or a regular or irregular polygonal cross-sectional shape.

7. The plasma generating apparatus of claim 1 wherein a plurality of the cells have a regular polygonal cross-sectional shape selected from the group consisting of: triangle, quadrilateral, pentagonal, hexagonal, heptagonal, octagonal, and combinations thereof.

8. A method of treating at least one surface of a generally cylindrically-shaped substrate, comprising:
   (a) positioning at least one surface of the substrate in close proximity to at least one cathode assembly of a plasma generating apparatus, the cathode assembly comprising a plurality of electrically conductive hollow plasma generating cells in a cylindrically-shaped array arranged on a cylindrical surface, the cells being electrically connected to each other;
   (b) supplying at least one plasma precursor gas to the vicinity of the cathode assembly and the substrate;
   (c) generating a plasma by supplying power to the cathode assembly; and
   (d) exposing the at least one surface of the substrate to the plasma for a time sufficient to form a treated surface.

9. The method of claim 8 wherein the substrate is a polyimide.

10. The method of claim 8 wherein the substrate is a polyester.

11. The method of claim 8 wherein the substrate is a polyester selected from polyethylene terephthalate homopolymer or a copolymer of ethylene terephthalate wherein up to about 50 mole percent of the copolymer is prepared from the monomer units of diethylene glycol; propane-1,3-diol; butane-1,4-diol; polytetramethylene glycol; polyethylene glycol; polypropylene glycol and 1,4-hydroxymethylcyclcohexane substituted for the glycol moiety in the preparation of the copolymer, or isophthalic, dibenzoic; naphthalene 1,4- or 2,6-dicarboxylic; adipic; sebacic; and decane-1,10-dicarboxylic acid substituted for the acid moiety in the preparation of the copolymer.

12. The method of claim 11 wherein the substrate is a biaxially oriented poly(ethylene)terephthalate container.

13. A method for packaging a liquid in a molded biaxially oriented, generally cylindrically-shaped polyester container which comprises:

(a) forming a molded biaxially oriented polyester container;

(b) exposing at least one surface of the container to a plasma generated from a plasma precursor gas comprising a hydrocarbon using a cathode assembly of a plasma generating apparatus, the cathode assembly comprising a plurality of electrically conductive hollow plasma generating cells in a cylindrically-shaped array arranged on a cylindrical surface, the cells being electrically connected to each other;

(c) introducing a liquid into the container; and (d) sealing the container.

14. The method of claim 13 further comprising purging the plasma precursor gas from the container before introducing the liquid.

15. A method for reducing the gas permeability of a generally cylindrically-shaped polyester substrate, comprising:

exposing at least one surface of the polyester substrate to a plasma generated from a plasma precursor gas comprising a hydrocarbon using a cathode assembly of a plasma generating apparatus, the cathode assembly comprising a plurality of electrically conductive hollow plasma generating cells in a cylindrically-shaped array arranged on a cylindrical surface, the cells being electrically connected to each other.

\* \* \* \* \*